Nov. 24, 1970 B. A. LABOUE 3,543,226

CONNECTORS FOR PRINTED CIRCUIT CARDS AND THE LIKE

Filed Aug. 7, 1968 2 Sheets-Sheet 1

Inventor:
Bernard Andre Laboue
BY Baldwin Wight Diller & Brown
Attorneys

Nov. 24, 1970 B. A. LABOUE 3,543,226

CONNECTORS FOR PRINTED CIRCUIT CARDS AND THE LIKE

Filed Aug. 7, 1968 2 Sheets-Sheet 2

3,543,226
Patented Nov. 24, 1970

3,543,226

CONNECTORS FOR PRINTED CIRCUIT CARDS AND THE LIKE

Bernard André Laboue, Goussainville, France, assignor to Societe Industrielle Bull-General Electric Societe Anonyme, Paris, France Filed Aug. 7, 1968, Ser. No. 750,954
Claims priority, application France, Aug. 23, 1967, 118,689
Int. Cl. H05k *1/12*
U.S. Cl. 339—176 7 Claims

ABSTRACT OF THE DISCLOSURE

A connector adapted to receive an extremity of a printed circuit card which is provided with contact pads, comprises an insulating body with at least one series of aligned recesses for positioning contact elements intended to engage corresponding pads of said card. Each contact element is flat and thin to permit reduced spacing of these elements and ease of mounting results from a wedge-shaped enlargement on a stem portion of each contact element.

Figure 1:
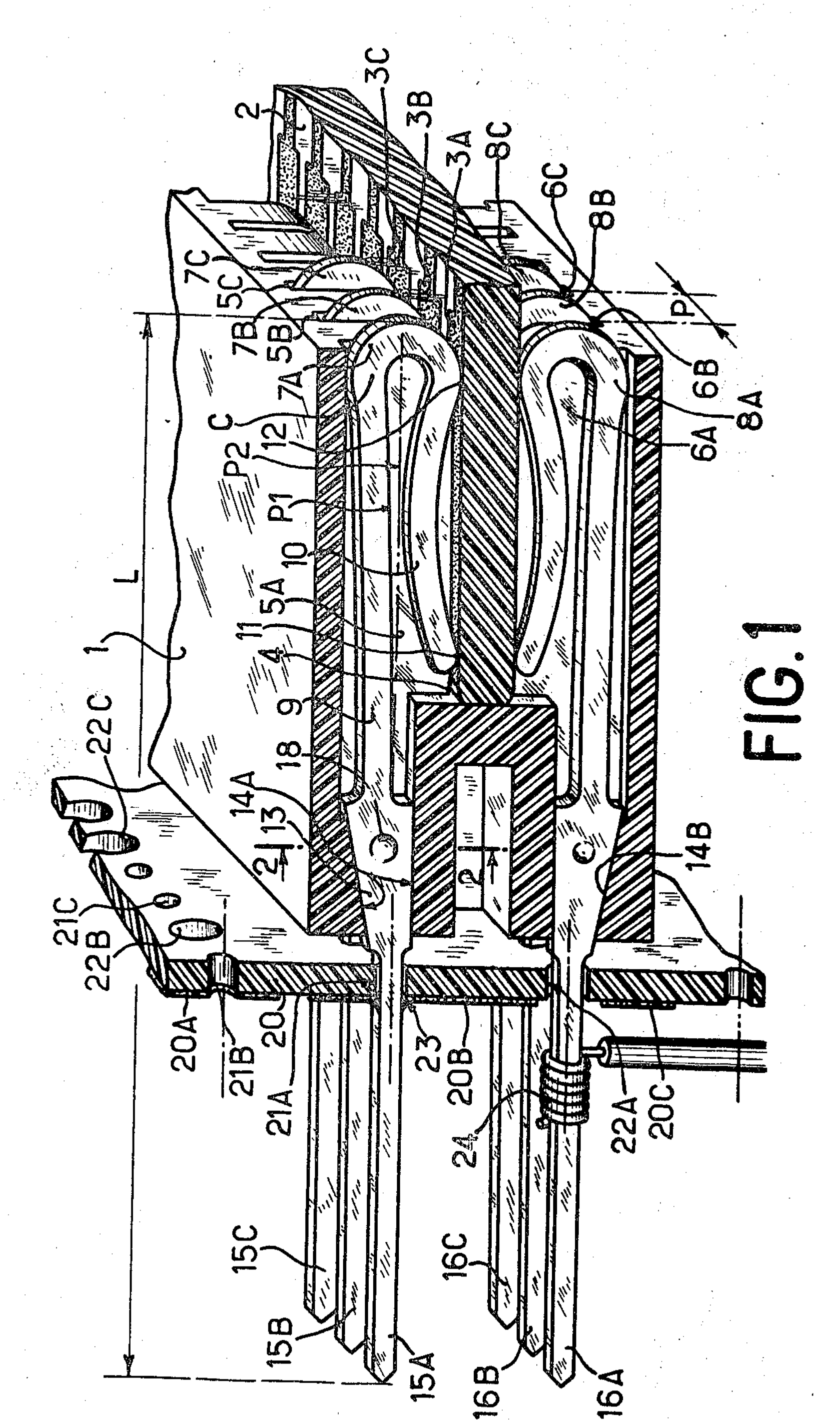

The present invention relates to improvements in connetcors intended to receive printed circuit cards and the like and concerns more particularly improvements in the construction of connectors for "double-face" printed circuit cards.

A "double-face" printed circuit card comprises an insulating plate provided on its two faces with printed circuits or other circuit elements, which are electrically connected to contact pads situated on either side with regular spacing along one edge of the card which is adapted to be engaged in a connector.

A connector comprises an insulating body for contact elements which are disposed in the connector in order to come into contact with the contact pads of a printed circuit card engaged in the said connector, so as to connect the said contact pads to other electric circuits.

A connector of this type has been described in a patent application filed in the United States on June 8, 1961, for "Connectors for Printed Circuits or the Like," now Pat. No. 3,118,716.

The arrangements described in the said patent have certain disadvantages as compared with arrangements at present known, but the rapid development of the techniques employed in the construction of electronic equipment and more particularly in the construction of electronic equipment employed for data processing has made it necessary for the designers to provide circuits of increasing complexity and to assemble them in a relatively decreasing volume. For very varied technical reasons, many of these circuits are constructed in the form of detachable cards on which circuits of ever increasing density are assembled. These cards are connected with the other circuits through connectors which must be provided with a large number of contact elements disposed very close together, so that they can be employed in a maximum number of combinations.

One object of the inevntion is to provide a simple and robust connector which satisfies all the aforesaid conditions and which is provided with special means to permit ready maintenance and if necessary rapid replacement at low cost of defective or damaged contact elements. One feature of the invention resides in that, in contrast to arrangements still employed, the contact element of a contact element does not necessitate the use of locking engagement and in that the positioning or replacement of a contact element does not necessitate the use of a special tool without which the extraction of a contact element generally involves serious damage to the insulating support.

A connector according to the invention is intended to receive the end of a printed circuit card provided with contact pads and comprises an insulating body which is formed with aligned recesses, each of which is adapted to receive one contact element arranged to afford an electrical contact with a contact pad of the card. Each contact element comprises a stem portion terminated at one end by a bent-over portion of double curvature adapted to contact a contact pad at two points and provided at the other end with a wedge-shaped enlargement provided with a boss and adapted to be introduced with force into a recess of variable rectangular cross-section, the said enlarged portion being extended by a contact lug extending outside the insulating body to receive electrical connections.

Figure 5:
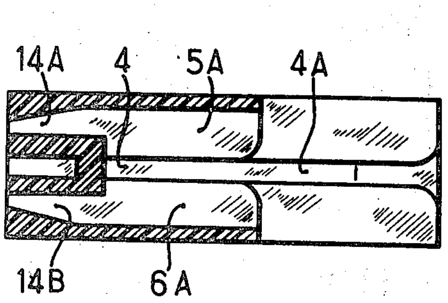
Figure 4:
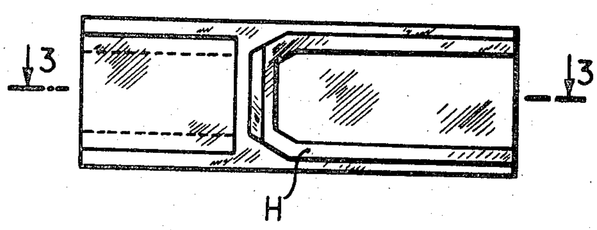
Figure 3:
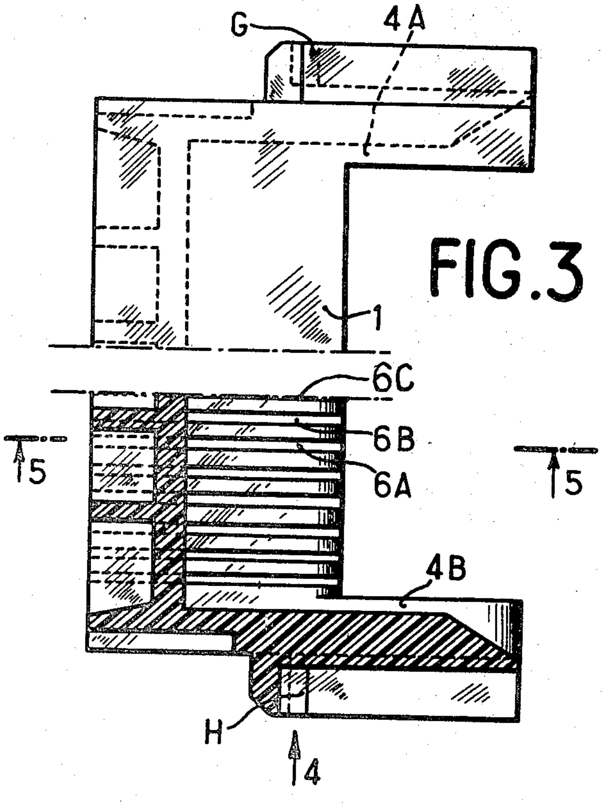
Figure 2:
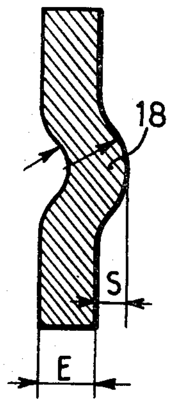

Further advantages and features of the invention will be more readily apparent from the following description and on reference to the accompanying drawings, in which:

FIG. 1 is a sectional view in perspective of a part of a connector with a part of a printed circuit card engaged in the said connector, FIG. 2 is a detailed view, to a large scale, of a part of a contact element as seen in section along 2—2 of FIG. 1, FIG. 3 is a plan view of a part of an insulating connector body as seen partially in section along 3—3 of FIG. 4, FIG. 4 is an external view of the insulating body as seen in the direction of the arrow 4 of FIG. 3, and FIG. 5 is a sectional view of the insulating support along 5—5 of FIG. 3.

The connector partly illustrated in FIG. 1 comprises an insulating body 1 which is shown in greater detail in FIGS. 3, 4 and 5. The length of this body may vary in accordance with the number of contact elements of the connector and in accordance with the dimensions of the printed circuit cards which it is to receive. The said integrally formed body may with advantage be moulded from an insulating material known under the name "Makrolon" (registered trademark). This is a polycarbonate mixed with about 20% by weight of glass fibres of small length. With this material, connectors for 80 to 100 contact elements and even more are readily produced. Makrolon ensures good mechanical strength in time and excellent electrical insulation of the contact elements.

The insulating body 1 has at its centre (FIG. 1) a cavity 4, and lateral grooves 4A and 4B (FIGS. 3 and 5) designed to receive and guide a printed circuit card 2 provided with contact pads 3A, 3B, 3C . . . which are electrically connected to printed circuits on the card. The insulating body is formed with recesses 5A, 5B, 5C . . . and 6A, 6B, 6C . . .(FIGS. 1, 3 and 5) on either side of the cavity 4 and perpendicular thereto, each to receive a contact element 7A, 7B, 7C in positions which each correspond to one contact pad of the upper face of the card, and contact elements 8A, 8B, 8C for the contact pads of the lower face of the card.

The insulating body 1 which is shown in FIGS. 3, 4 and 5 is provided at its ends (FIGS. 3 and 4) with extensions G and H, the shape of which is adapted to the mode of attachment adapted to mount connectors on a frame. It is obvious that these parts may be given any shape considered appropriate in accordance with the mode of attachment or may even be omitted in accordance with the use envisaged.

Each contact element of the connector is flat and may be formed by pressing or cutting from an electrically conductive resilient metal sheet or in any other appropriate way. A contact element (7A, FIG. 1) comprises a flexible stem portion 9 of substantially uniform cross-section which is terminated at one end by a bent-over portion 10 of curvature adapted in known manner to contact, at two points 11 and 12, a contact pad 3A of the card 2 engaged. The other end of the stem portion 9 is provided with a wedge-shaped enlargement 13, namely a first portion parallel to the plug-in direction and a second portion which is highly inclined in relation to the first portion to correspond to the shape of the corresponding portion 14A of the cavity. The enlargement 13 is provided with a boss 18 projecting from its face, so that the contact element must be introduced into its recess with force. The wedge-shaped enlargement 13 is outwardly extended from the insulating body by a lug portion 15A (15B, 15C . . . 16A, 16B, 16C . . . for the other contact elements), which is elongate and rectilinear to form a contact lug which may be connected to other circuits, as will hereinafter be shown.

When positioned in its corresponding recess in the insulating body 1, each contact element is in a plane with its longer cross-sectional dimension perpendicular to the corresponding contact pad of the card.

In FIG. 1, the card 2 is shown engaged in the connector between contact elements 7A, 7B, 7C . . . and elements 8A, 8B, 8C and the stem portion 9 of the contact element 7A is shown flexed in a position P1 owing to the presence of the card in the connector, but in the absence of the latter the lower edge of the portion 9 returns by resilient action into a position P2. The contact element 8A, as also the other contact elements of the conncetor, have identical features and consequently they bear on contact pads of the card under the same conditions.

In a connector such as that illustrated to a large scale in FIG. 1, the contact elements may have a total length L of about 37 millimetres for a uniform thickness E (FIG. 2) of 0.5 mm., all proportions being retained. The spacing P of the contacts in such a connector will be, for example, 2.54 mm.

The portion C of the contact element 7A situated between the stem portion 9 and the double-curvature bent-over portion 10 has a larger cross-section than the said portions, while the width of the portion 10 decreases gradually from the point 12 to the point 11. This form has been experimentally determined by studying by photoelastimetry, by means of large-scale "Plexiglas" (registered trademark) models, the intensity and distribution of the mechanical stresses produced in a contact element by consecutive flexures on introduction of a card into a connector. This work has made it possible to employ for the manufacture of the contact elements a phosphor bronze of conventional quality in place of special metals, such as beryllium bronze, which are much more costly and more difficult to work, while remaining within the normal conditions of use of the metal. Thus, contact elements produced under the aforesaid conditions make it possible to provide normally, at the points of contact 11 and 12, a contact pressure of 100 to 300 grams on the contact pads, while ensuring that the stresses of the metal, due to deformation, remain below or at most equal to 75% of the elastic limit.

In order to facilitate the mould release of the insulating body in its manufacture, to ensure free movement of the flexible parts of the contact elements in the connector and to facilitate positioning of the said elements in their recesses, the recesses 5A, 5B, 5C . . . and 6A, 6B, 6C . . . which receive contact elements have a minimum width in the wedge-shaped portion, which is however still slightly greater than the width E of the contact. Very reliable fixing of the contacts in their recesses is ensured by the enlarged portion 13, which is wedge-shaped in order to centre and maintain each contact member in position in its recess, and by means of the lateral protuberance or boss 18 (FIG. 2), of which the projection S represents about one-half of the thickness E of the contact and completes the fixing. Under these conditions, towards the end of the positioning of each contact element in its recess, it is necessary to exert on the contact lug 15A which projects from the insulating body a tractive force of about 10 kilogrammes, which ensures substantially perfect locking of the enlarged portion 13 of the contact element in its recess. However, the said contact can readily be disengaged from the said recess by a thrust of a few kilogrammes exerted in the opposite direction. It is obvious that under these conditions the action exerted by friction on the contact surfaces of the contact elements when a card is extracted from the connector cannot in any circumstances pull a contact element out of its recess.

In order to ensure perfect electrical contact of the contact elements with the contact pads on the cards, at least the parts 11 and 12 of the bent-over portion 10 of the contact elements are electrolytically gold-plated or coated with another inoxydisable metal of high electrical conductivity, as also are the contact pads on the cards.

The dimensions and characteristics of various elements of a connector which have been indicated in the foregoing have no limiting character, because it has been found possible, by application of the same principles, to produce much smaller connectors which are perfectly adapted for use with circuits of extremely small dimensions, called "miniaturised circuits", also provided with contact pads.

Connectors according to the invention may be juxtaposed and electrically coupled together and to other circuits by means of connecting boards, as illustrated in FIG. 1.

A connecting board 20 is a board provided with printed circuits 20A, 20B, 20C, and formed with holes 21A, 21B, 21C and 22A, 22B, 2C which are so positioned as to allow the passage of the connecting lugs 15A, 15B, 15C . . . and 16A, 16B, 16C . . . of the contact elements. It is possible by means of a connecting board to establish rapidly and perfectly most of the interconnections, voltage connections and the earth connections of the contacts of one or more connectors. The contact lug 15A (FIG. 1), as also all the contact lugs situated under the same conditions, extend through a hole 21A of small dimensions in a printed circuit element 20B, of which the conductive part extends into immediate proximity to the lug 15A. Considering a number of juxtaposed conductors, a number of contact lugs which are engaged in holes similar to the hole 21A, a large number of electrical connections 23 may be rapidly established for these contact lugs by passing the board 20 in known manner through a tin bath provided with a surge to establish by soldering all the desired electrical connections between the contacts of the connectors and the printed circuits of the board. Of course, the soldering of certain contact lugs can be prevented by passing them through holes 22A, 22B, 22C which are larger than the holes 21A, 21B and 21C and sufficiently large to prevent the tin bath from establishing electrical connections between the contact lugs which pass through these holes and printed circuit elements on the connecting board. It is also possible to form the connecting board with holes (22A) which are all of the same dimensions, but it will be necessary to terminate the conductive surfaces of the printed circuits sufficiently far from the contact lugs to prevent soldered connections from being established between them. A number of connecting boards may be mounted in the same way on the contact lugs of the connectors, whereafter connections 24 may be established on the remaining contact lugs either by winding-on a conductor (as shown in FIG. 1) or by soldering or by any other means (connecting elements threaded, for example, on to the lugs of the contact elements).

If printed circuit cards comprising contact pads only on a single face are employed, the connector may be accordingly designed i.e. only a single series of contact elements may be mounted on the side of the corresponding face of the card.

It is obvious that other modifications and adaptations could be made to the described arrangements, depending upon the circumstances and applications, without departing from the invention.

What is claimed is:

1. A connector adapted to receive, in a particular plugging direction, a printed circuit card provided with contact pads, which connector comprises an insulating body provided with at least one series of aligned recesses; a series of flat contact elements, each of said recesses positioning one of said contact elements essentially in a plane with its longer cross-sectional dimension perpendicular to a corresponding contact pad of the card; each contact element having, transverse to said perpendicular plane, a constant thickness which is much smaller than the spacing between the recesses, and comprising a single stem portion substantially parallel to the said plugging direction, which has at one end a bent-over portion curved to contact at two points a corresponding contact pad of a card engaged in the connector, the said stem portion being provided at the other end with a wedge-shaped enlargement having a first edge parallel to the said plugging direction and a second edge inclined in relation to the first edge, to correspond to the variable cross-sectional form of a said recess.

2. A connector according to claim 1, wherein the enlargement of said contact element is provided with a pressed-out portion forming a boss projecting from one face, so that the enlarged portion of a contact element is necessarily introduced into its recess under force.

3. A connector according to claim 1, wherein that portion of said contact element which is situated between the stem portion and the bent-over portion has a rectangular cross-section which is longer in and parallel to said plane than that of the stem portion and of the said bent-over portion.

4. A connector according to claim 1, comprising two series of contact elements aligned and arranged to correspond respectively to contact pads situated on the two opposite faces of a printed circuit card.

5. A connector according to claim 1, wherein each contact element is made of phosphor bronze.

6. A connector according to claim 1 including a connecting lug portion extending rectilinearly outwardly from at least certain of said wedge-shaped enlargements.

7. A connector according to claim 3 wherein said wedge-shaped enlargements are provided respectively with lateral protuberances forming bosses providing for force-fitting of said enlargements into said recesses.

References Cited

UNITED STATES PATENTS

| | | | |
|---|---|---|---|
| 2,497,484 | 2/1950 | Wood | 339—221 |
| 3,054,165 | 9/1962 | Braun et al. | 339—221 XR |
| 3,133,774 | 5/1964 | Bulk et al. | 339—221 XR |

FOREIGN PATENTS

| | | |
|---|---|---|
| 1,071,182 | 12/1959 | Germany. |

MARVIN A. CHAMPION, Primary Examiner

P. A. CLIFFORD, Assistant Examiner

U.S. Cl. X.R.

339—17, 221